(12) United States Patent
Li et al.

(10) Patent No.: US 10,163,810 B2
(45) Date of Patent: Dec. 25, 2018

(54) ELECTROMAGNETIC INTERFERENCE SHIELDING FOR SYSTEM-IN-PACKAGE TECHNOLOGY

(71) Applicant: Intel Corporation, Santa Clara, CA (US)

(72) Inventors: Eric J. Li, Chandler, AZ (US); Yoshihiro Tomita, Tsukuba (JP); Nachiket R. Raravikar, Gilbert, AZ (US); Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/998,089

(22) Filed: Dec. 26, 2015

(65) Prior Publication Data

US 2017/0186699 A1    Jun. 29, 2017

(51) Int. Cl.
| | |
|---|---|
| *H04M 1/02* | (2006.01) |
| *H01L 23/552* | (2006.01) |
| *H01L 25/065* | (2006.01) |
| *H01L 23/31* | (2006.01) |
| *H01L 23/538* | (2006.01) |
| *H01L 25/00* | (2006.01) |
| *H01L 21/78* | (2006.01) |

(Continued)

(52) U.S. Cl.
CPC ...... *H01L 23/552* (2013.01); *H01L 21/31105* (2013.01); *H01L 21/6835* (2013.01); *H01L 21/78* (2013.01); *H01L 23/3128* (2013.01); *H01L 23/5386* (2013.01); *H01L 24/97* (2013.01); *H01L 25/0655* (2013.01); *H01L 25/50* (2013.01); *H01L 2924/15311* (2013.01); *H01L 2924/1815* (2013.01)

(58) Field of Classification Search
CPC ... H01L 23/552; H01L 21/78; H01L 23/3128; H01L 23/5386; H01L 25/50; H01L 21/565; H01L 25/0655; H01L 24/27; H01L 24/33; H01L 21/6835; H01L 21/31105; H01L 21/563; H04M 1/026
See application file for complete search history.

(56) References Cited

U.S. PATENT DOCUMENTS

| | | | |
|---|---|---|---|
| 8,420,437 B1 * | 4/2013 | Fan | H01L 23/552 257/419 |
| 2004/0231872 A1 * | 11/2004 | Arnold | H01L 23/04 174/377 |

(Continued)

OTHER PUBLICATIONS

International Search Report and Written Opinion for PCT Patent Application No. PCT/US16/57541 dated Feb. 15, 2017, 13 pgs.

*Primary Examiner* — Chuong A Ngo
(74) *Attorney, Agent, or Firm* — Schwabe, Williamson & Wyatt, P.C.

(57) ABSTRACT

Embodiments are generally directed to electromagnetic interference shielding for system-in-package technology. An embodiment of a system-in-package includes a substrate; chips and components attached to the substrate; dielectric molding over the chips and components; and an electromagnetic interference (EMI) shield. The EMI shield formed from a conductive paste, and the EMI shield provides a combined internal EMI shield between chips and components of the system in package and external EMI shield for the system-in-package.

19 Claims, 11 Drawing Sheets

(51) Int. Cl.
_H01L 21/683_ (2006.01)
_H01L 21/311_ (2006.01)
_H01L 23/00_ (2006.01)

(56) References Cited

U.S. PATENT DOCUMENTS

| | | | |
|---|---|---|---|
| 2006/0148370 A1* | 7/2006 | Kadono | B01J 37/34 |
| | | | 445/51 |
| 2008/0174013 A1 | 7/2008 | Yang et al. | |
| 2011/0304015 A1 | 12/2011 | Kim et al. | |
| 2012/0025356 A1 | 2/2012 | Liao et al. | |
| 2012/0273926 A1* | 11/2012 | Pagaila | H01L 23/552 |
| | | | 257/659 |
| 2012/0300412 A1* | 11/2012 | Song | H01L 23/552 |
| | | | 361/728 |
| 2013/0082364 A1 | 4/2013 | Wang et al. | |
| 2013/0082368 A1 | 4/2013 | Kim et al. | |
| 2015/0069637 A1* | 3/2015 | Zhao | H01L 24/29 |
| | | | 257/778 |

* cited by examiner

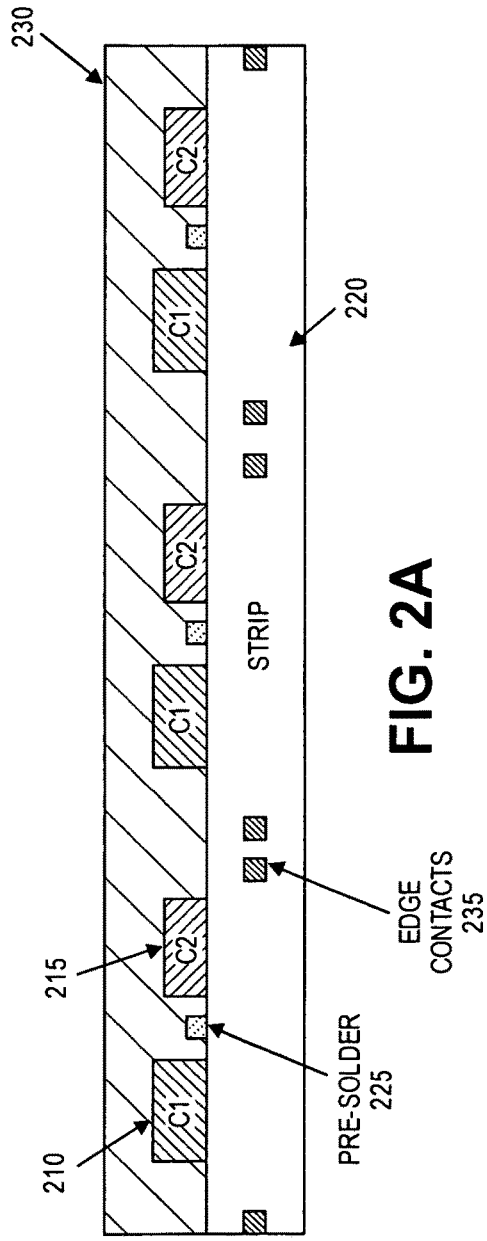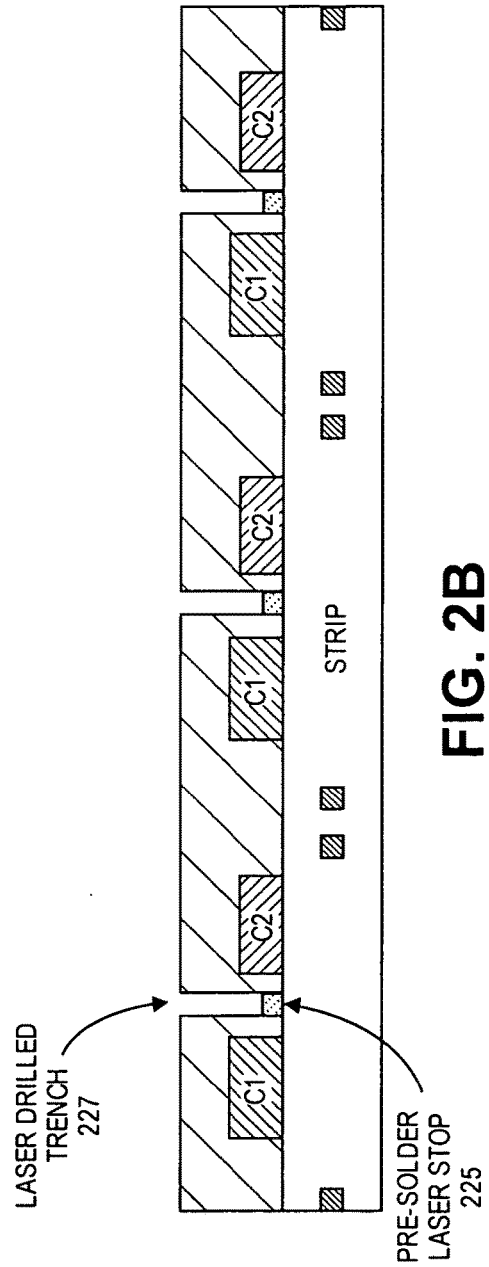

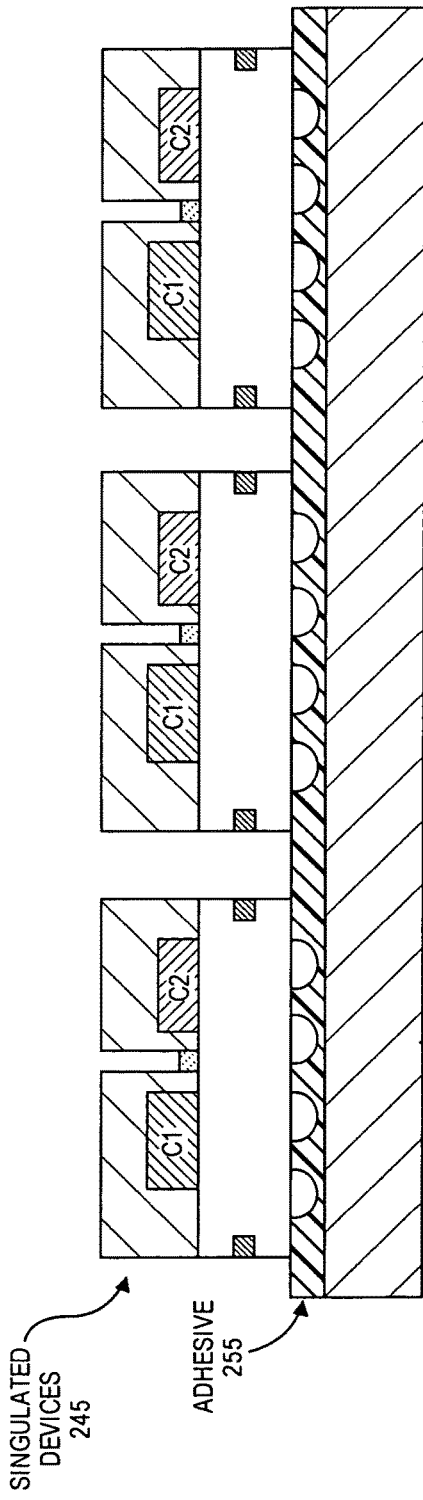
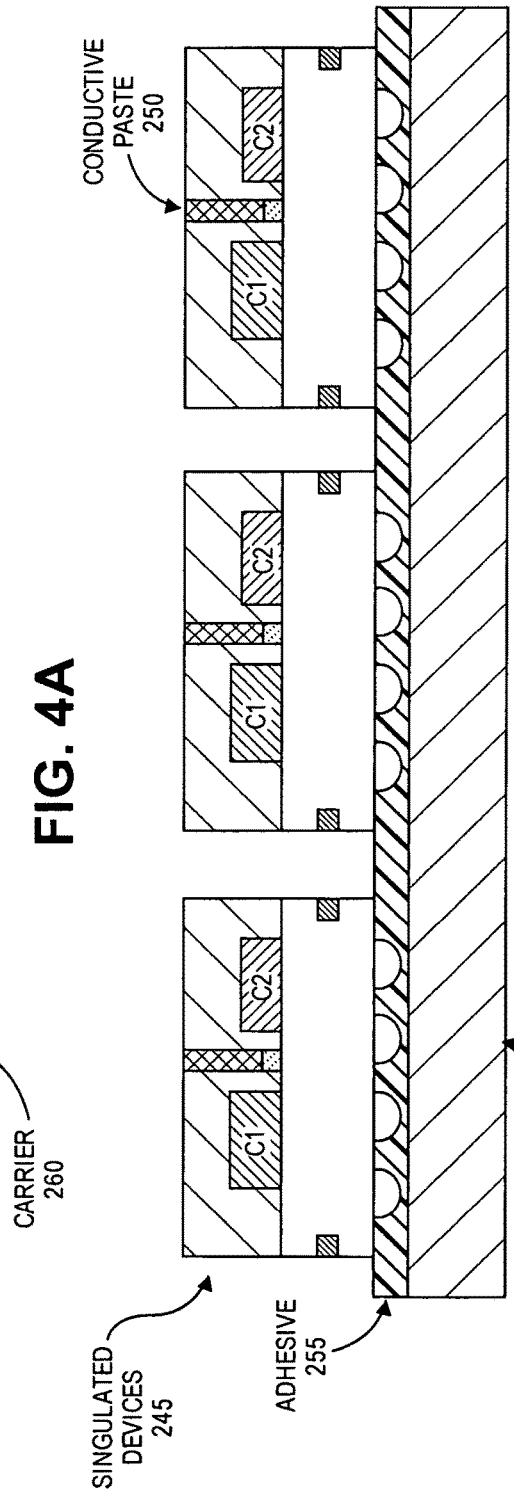

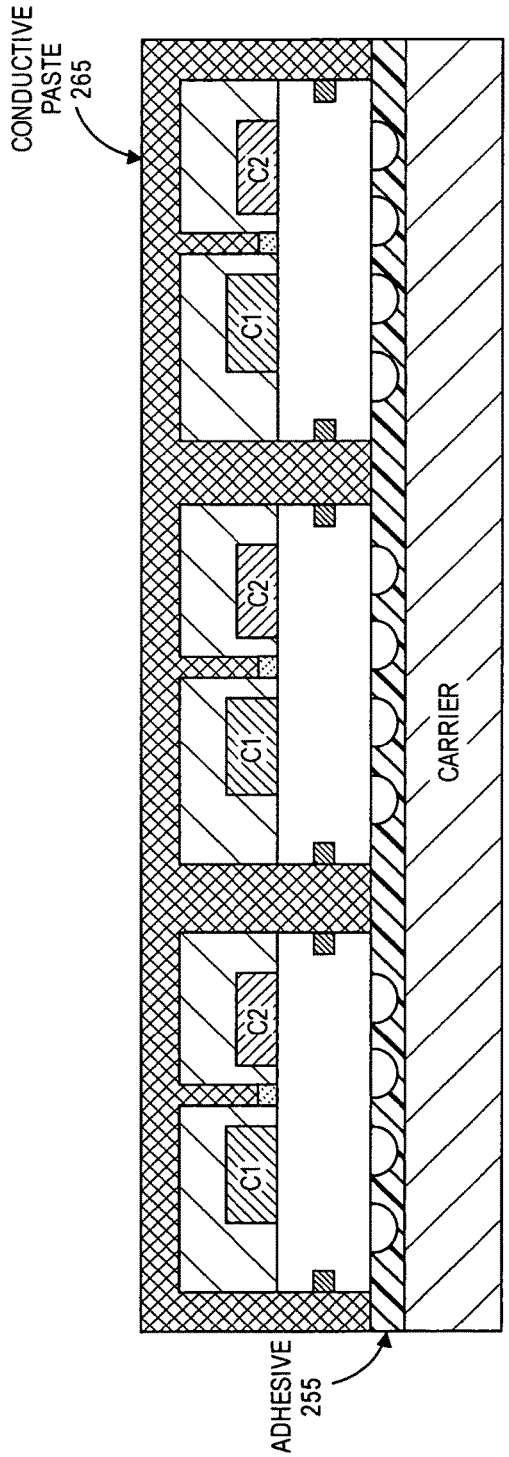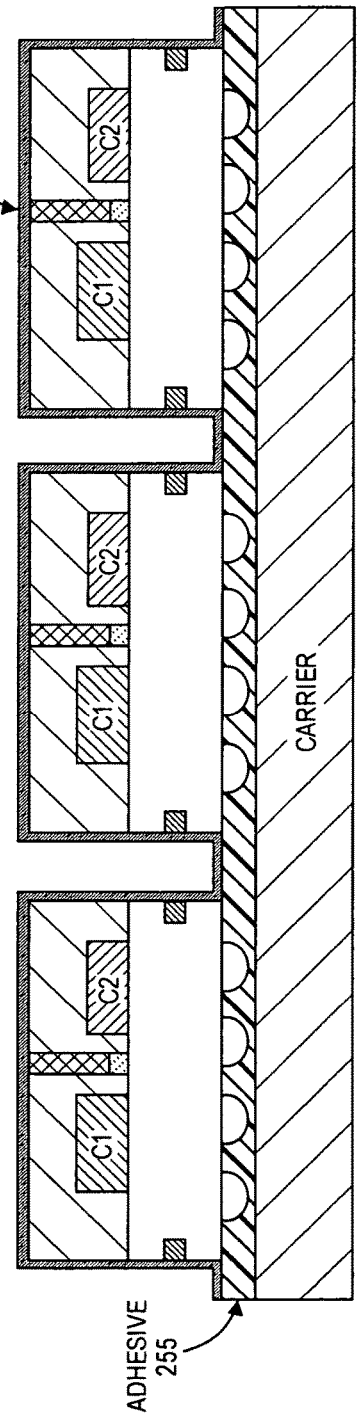

ELECTROMAGNETIC INTERFERENCE SHIELDING FOR SYSTEM-IN-PACKAGE TECHNOLOGY

TECHNICAL FIELD

Embodiments described herein generally relate to the field of electronic devices and, more particularly, to electromagnetic interference shielding for system-in-package technology.

BACKGROUND

In fabricating a system-in-package (SiP), one of the necessary processes is the application of electromagnetic interference (EMI) shielding, which is required to minimize EMI between the components in the package, and with other devices.

A conventional process for EMI shielding for a system-in package with a small form factor is a two-step process, wherein a through-mold laser trench drilling process is followed by conductive paste dispense or printing to form an internal EMI shielding in between components in the SiP. Commonly a physical vapor deposition process by sputtering of copper is then used to produce an external EMI shielding for the entire SiP.

This conventional EMI shielding method, although generally effective in producing an EMI shield in a small form factor, is complex and expensive due to the two-step processing for EMI shielding and due to the high equipment cost and low deposition rate of the sputtering process.

BRIEF DESCRIPTION OF THE DRAWINGS

Embodiments described here are illustrated by way of example, and not by way of limitation, in the figures of the accompanying drawings in which like reference numerals refer to similar elements.

FIG. 2A is an illustration of initial processes for device fabrication according to an embodiment;

FIG. 2B is an illustration of trench drilling for internal EMI shielding;

FIG. 4A is an illustration of picking and placing devices onto a carrier according to an embodiment;

FIG. 4B is an illustration of picking and placing devices onto a carrier in a process;

FIG. 5A is an illustration of application of conductive paste according to an embodiment;

FIG. 5B is an illustration of conformal sputtering for external EMI shielding in a process;

DETAILED DESCRIPTION

Embodiments described herein are generally directed to electromagnetic shielding for system-in-package technology.

For the purposes of this description:

"System-in-package" or "SiP" means a package or module that includes multiple integrated circuits and that provide all or part of the functions of an electronic system, including a mobile electronic device.

"Mobile electronic device" or "mobile device" means a smartphone, smartwatch, tablet computer, notebook or laptop computer, handheld computer, mobile Internet device, wearable technology, or other mobile electronic device that includes processing capability.

In some embodiments, an apparatus, system, or method includes low cost fabrication of electromagnetic shielding for system-in-package technology. In some embodiments, an internal and external EMI shielding process requires only a single process, the process applying using low cost and high throughput conductive paste printing technology.

In some embodiments, a low cost and high throughput conductive paste printing technology is used in a single processing step to form both the internal EMI shielding in between components in SiP and the external EMI shielding for the entire SiP. In some embodiments, a single process for internal and external EMI shielding simplifies the assembly process flow, and eliminates the requirement of an expensive and slow sputtering process. In general sputtering is very slow utilizing the amount of materials needed for EMI. For this reason, the sputtering process would commonly take multiple times longer than a process of depositing conductive paste.

Embodiments are not limited to particular conductive paste. A conductive paste will generally include conductive material in an adhesive (such as an epoxy) base. In some embodiments, a conductive paste is chosen to make electrical contact with the copper sidewalls of the package. In some embodiments, a conductive paste includes a sufficiently high level of conductivity as well as proper sufficient adhesive properties.

Figure 1:
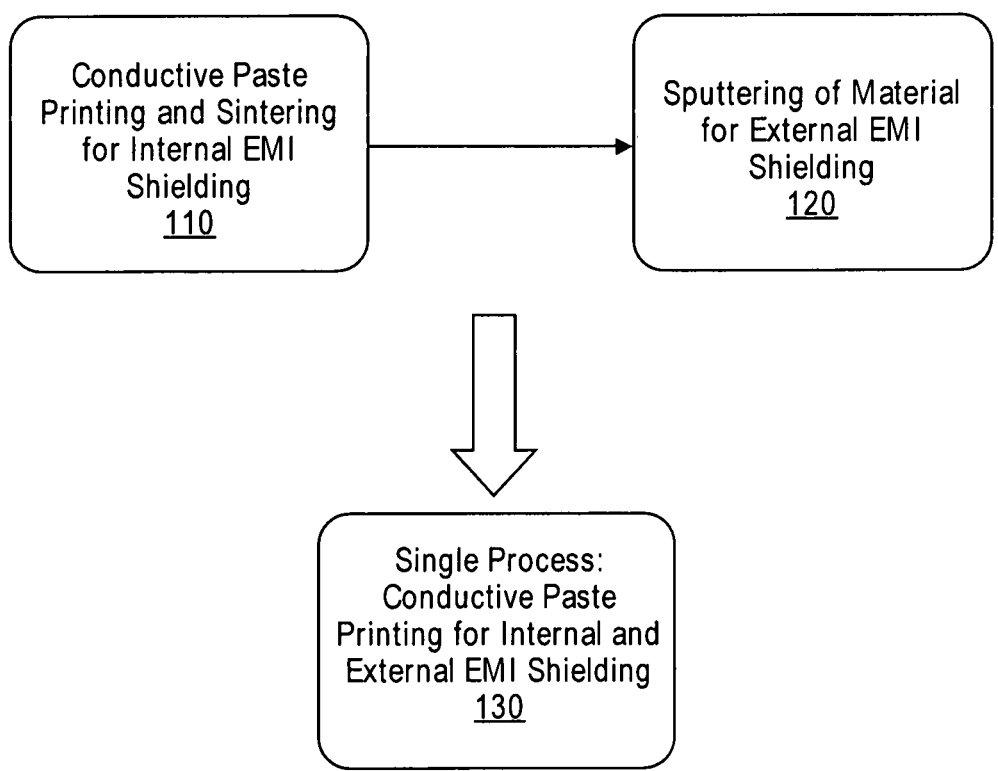
FIG. 1 is an illustration of EMI shielding processes for a system-in-package according to an embodiment.

FIG. 1 is an illustration of EMI shielding processes for a system-in-package according to an embodiment. In a conventional process, an EMI shielding processing includes conductive paste printing and sintering for internal EMI shielding 110 is followed by sputtering of material for external EMI 120. These processes add to the cost and complexity of the overall device fabrication.

In some embodiments, the EMI shielding processing is modified to include only a single conductive paste printing process for internal and external EMI shielding, instead of printing and sputtering. In this manner, more efficient and lower cost fabrication may be achieved by eliminating the expensive sputtering process from the assembly process flow.

In some embodiments, a process includes:

1—Enclosing a package with conductive paste EMI for both internal and external EMI shielding; and 2—Providing a trench between devices that is sufficiently wide enough to allow for sawing through the conductive paste to singulate devices.

Although the resistivity of conductive paste is higher than sputtered Cu (copper), and thus may require a thicker shielding and slightly larger form factors, the cost savings provided by process simplification and elimination of the expensive and slow sputter process may be significant in an overall fabrication process.

FIG. 2A is an illustration of initial processes for device fabrication according to an embodiment. In some embodiments, a pre-solder formation by paste printing is provided. In some embodiments, multiple chips and components (such as chip C1 210 and chip C2 215 are attached to a substrate strip 220, together with the application of pre-solder 225. In some embodiments, a process further includes capillary underfill (CUF) (if needed) and molding with dielectric material 230 to form the initial elements. In some embodiments, the substrate strip includes edge contacts (which are in general copper contact walls) 235.

FIG. 2B is an illustration of trench drilling for internal EMI shielding. In some embodiments, a through mold trench drilling process for the internal EMI shielding utilizing the pre-solder 225 as a laser stop. In some embodiments, a system-in-package includes at least one drilled trench for the formation of an internal EMI shielding.

Figure 3A:
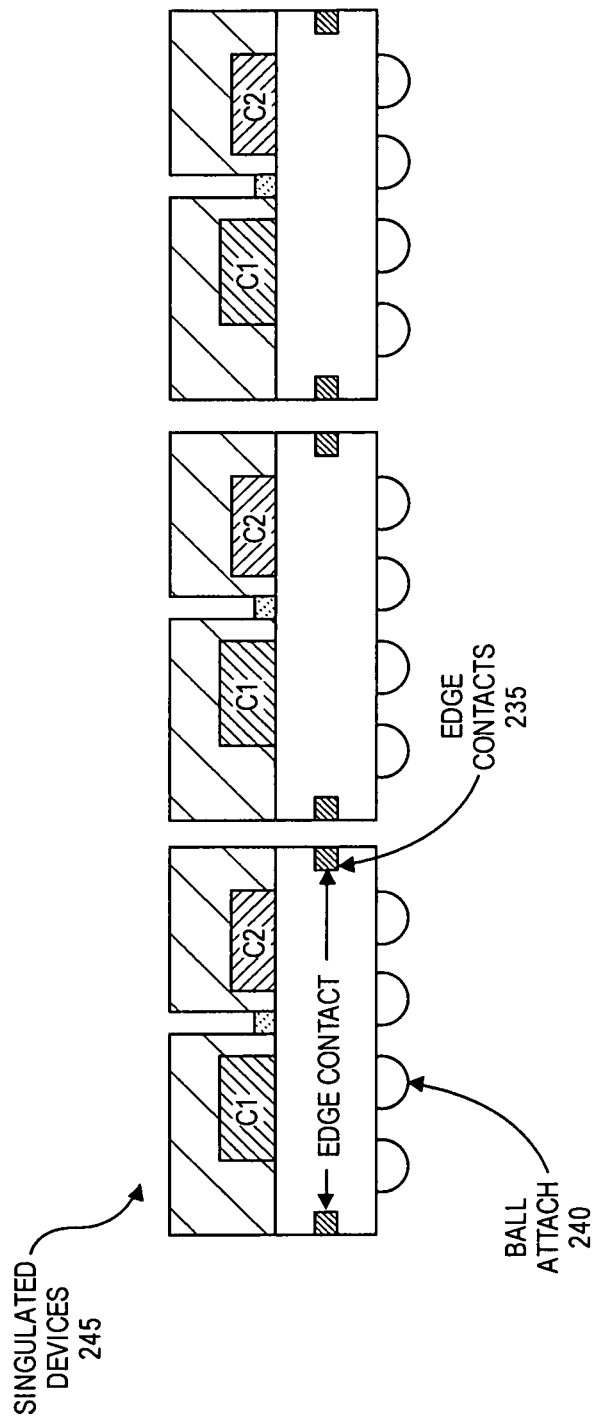
FIG. 3A is an illustration of ball attachment and device singulation according to an embodiment.

FIG. 3A is an illustration of ball attachment and device singulation according to an embodiment. In some embodiments, a process includes ball attachment 240 and the singulating of the system-in-package devices 245 to expose the edge contacts 235 for connection to a ground plane. In some embodiments, no conductive paste is applied at this point in a fabrication process.

Figure 3B:
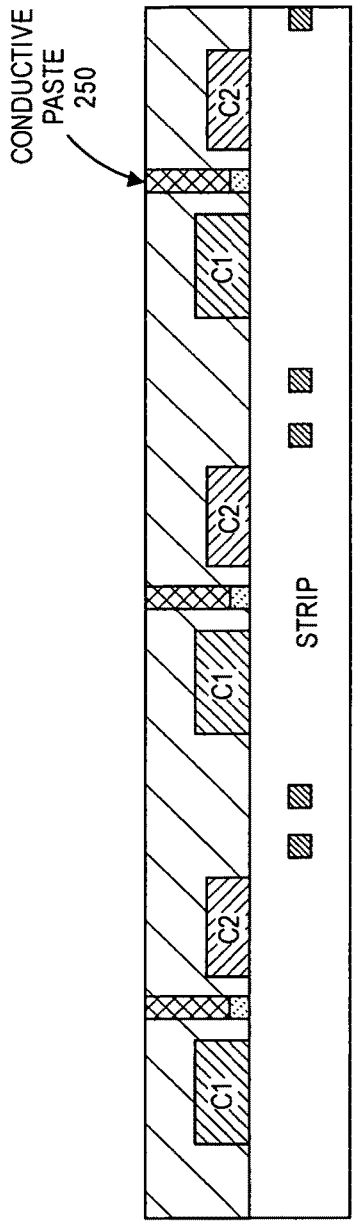
FIG. 3B is an illustration of conductive paste printing and sintering.
Figure 3C:
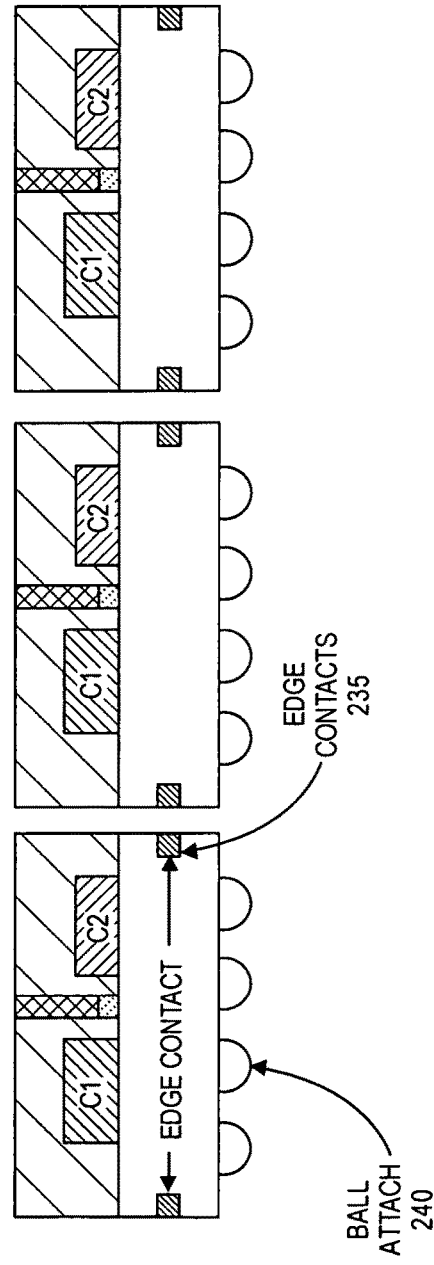
FIG. 3C is an illustration of ball attachment and device singulation.

In contrast, FIG. 3B is an illustration of conductive paste printing and sintering. As illustrated, a conventional process includes conductive paste 250 printing and sintering (wherein the temperature and duration required for sintering is dependent on the particular material) for internal EMI shielding. FIG. 3C is an illustration of ball attachment and device singulation. As illustrated, the conventional process includes ball contact attachment 240 and the singulating of the system-in-package devices 245 to expose the edge contacts 235. However, this is occurring subsequent to the conductive paste 250 printing and sintering process in FIG. 3B.

FIG. 4A is an illustration of picking and placing devices onto a carrier according to an embodiment. In some embodiments, a process proceeds with the pick and placing of the singulated devices 245 onto a carrier 260 to be bonded with an adhesive 255. In some embodiments, a process includes placement of devices with sufficient spacing to enable a sawing process through conductive paste at a completion of the fabrication process. In some embodiments, the spacing between devices is dependent on a chosen singulation technology for the process.

FIG. 4B is an illustration of picking and placing devices onto a carrier in a process. As illustrated, a conventional process proceeds with the pick and placing of the singulated devices 245 onto a carrier 260 to be bonded with an adhesive 255. However, the devices include the previously applied conductive paste 250.

FIG. 5A is an illustration of application of conductive paste according to an embodiment. In some embodiments, a process with vacuum printing of conductive paste 265 and is applied to remove air entrapment or voiding in the applied material followed by sintering. In some embodiments, the vacuum printing operation is applied to provide adequate coverage and voiding elimination of the conductive paste application.

In contrast, FIG. 5B is an illustration of conformal sputtering for external EMI shielding in a process. As illustrated in FIG. 5B, a conventional process proceeds with conformal sputtering of the device to generate an external EMI shielding 270 (where conformal sputtering refers to the formation of a coating that conforms to the contours of the device).

Figure 6A:
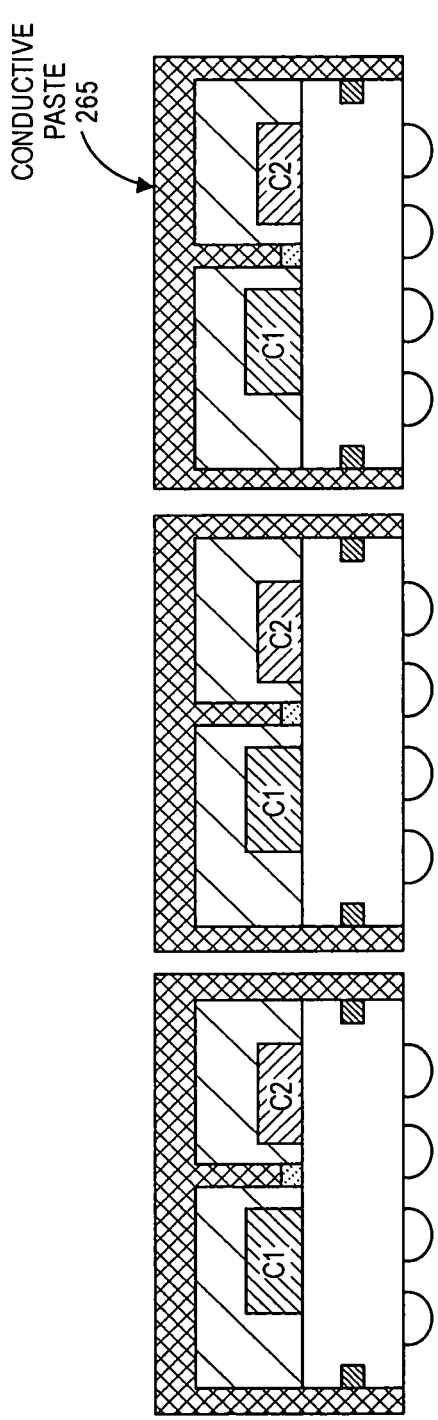
FIG. 6A is an illustration of carrier debonding and singulation according to an embodiment.

FIG. 6A is an illustration of carrier debonding and singulation according to an embodiment. In some embodiments, a process further includes adhesive release and debonding of the carrier, and the singulation of the SiP devices, wherein the singulation requires cutting through the conductive paste 265.

Figure 6B:
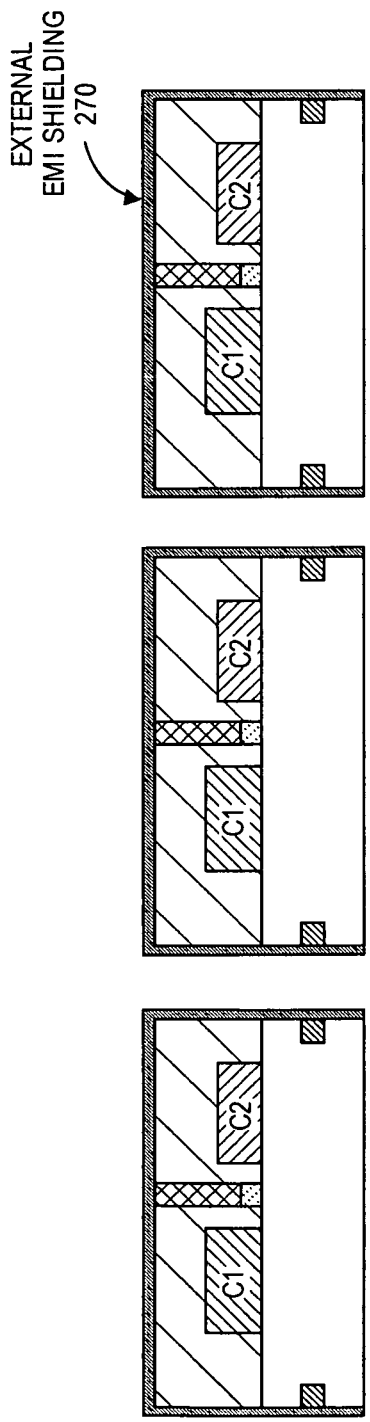
FIG. 6B is an illustration of carrier debonding in a process.

In contrast, FIG. 6B is an illustration of carrier debonding in a process. As illustrated in FIG. 6B, a conventional process continues with release of the adhesive 255 and the release of the previously singulated devices from the carrier 260.

Figure 7:
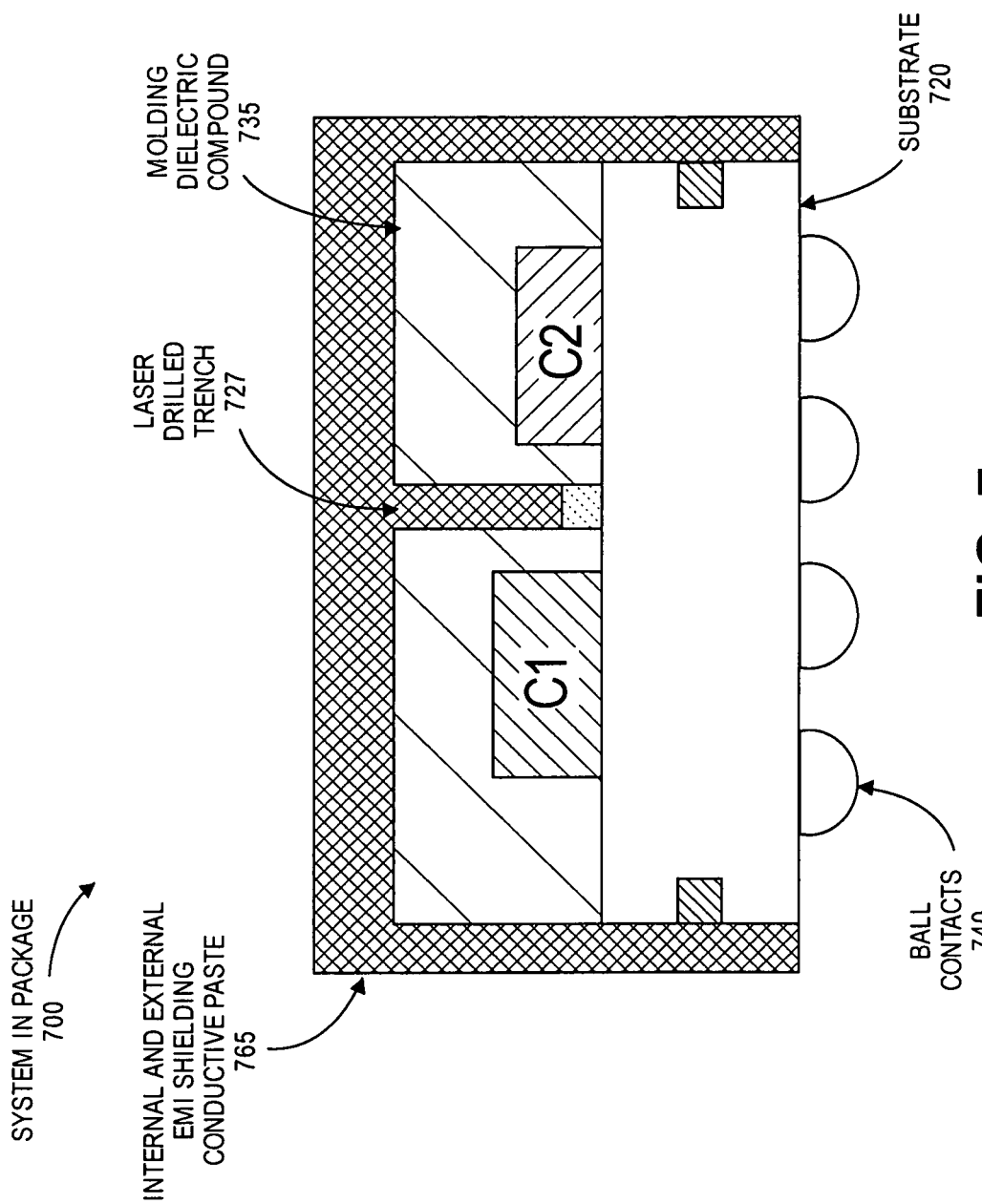
FIG. 7 is an illustration of a system-in-package according to an embodiment.

FIG. 7 is an illustration of a system-in-package according to an embodiment. In some embodiments, a system-in-package 700 includes multiple chips and components, including, for example, chips C1 and C2, attached to a substrate 720, to which there may be attached ball contacts 740. In some embodiments, the chips and components are molded in a molding dielectric compound 735 to generate a system-in-package. In some embodiments, the system-in-package includes at least one laser drilled trench 727 for internal EMI shielding.

In some embodiments, the system-in-package includes a combined internal and external EMI shielding fabricated with a conductive paste 765. In some embodiments, the shielding includes conductive paste that is vacuum printed and sintered to generate the internal and external EMI shielding.

Figure 8:
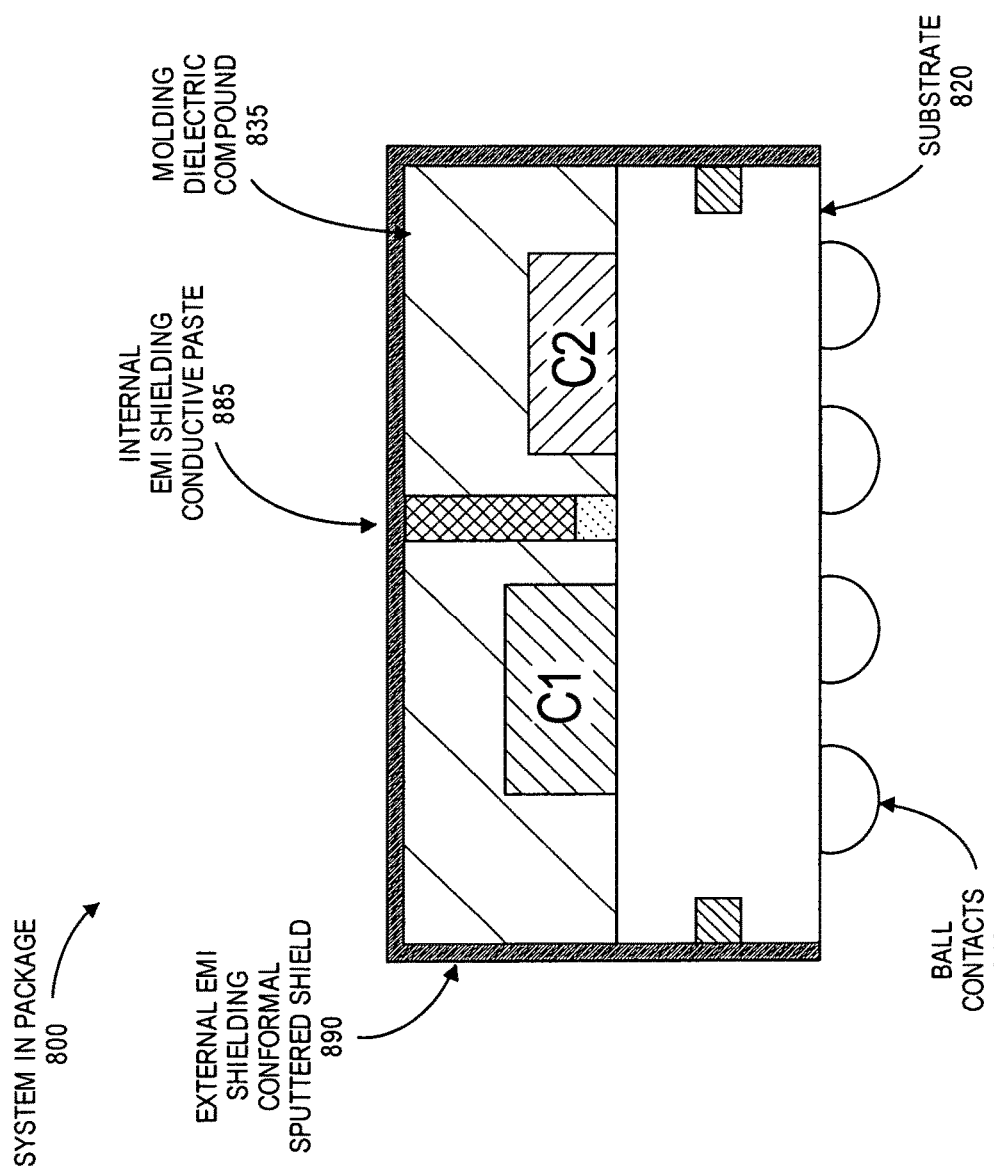
FIG. 8 is an illustration of a system-in-package fabricated in a process.

FIG. 8 is an illustration of a system-in-package fabricated in a process. As illustrated in FIG. 8, a system-in-package 800 fabricated in a conventional process includes multiple chips and components, including, for example, chips C1 and C2, attached to a substrate 820, to which there may be attached ball contacts 840. The chips and components are molded in a molding dielectric compound 835 to generate a system-in-package.

The system-in-package according to a conventional process includes separate internal and external EMI shielding, wherein an internal EMI shielding is fabricated with conductive paste 885 and an external EMI shielding is fabricated with a conformal sputtered shield 890.

Figure 9:
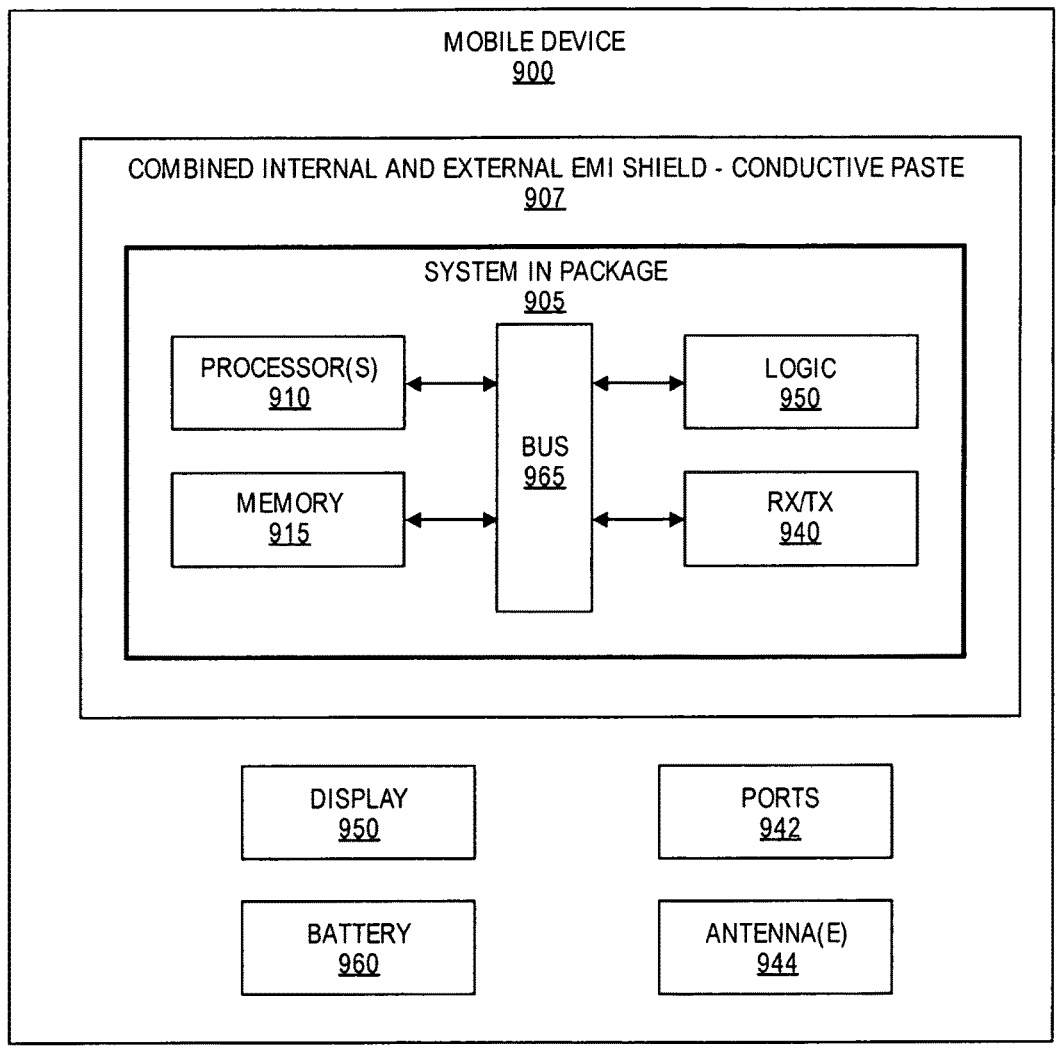
FIG. 9 is an illustration of an embodiment of a mobile device including a system-in-package according to an embodiment.

FIG. 9 is an illustration of an embodiment of a mobile device including a system-in-package according to an embodiment. In this illustration, certain standard and well-known components that are not germane to the present description are not shown. Elements shown as separate elements may be combined. In some embodiments, a mobile device 900 includes a system-in-package 905, wherein the system-in-package 905 includes a combined internal and external EMI shield 907, wherein the EMI shield is fabricated using a conductive paste.

In some embodiments, a system-in-package includes a processing means such as one or more processors 910 coupled to one or more buses or interconnects, shown in general as bus 965. In some embodiments, the processors 910 may include one or more general-purpose processors or special-processor processors. The bus 965 is a communication means for transmission of data. The bus 965 is illustrated as a single bus for simplicity, but may represent multiple different interconnects or buses and the component connections to such interconnects or buses may vary. The bus 965 shown in FIG. 9 is an abstraction that represents any one or more separate physical buses, point-to-point connections, or both connected by appropriate bridges, adapters, or controllers.

In some embodiments, the system-in-package 905 includes one or more memories 915, which may include a random access memory (RAM) or other dynamic storage device or element as a main memory for storing information and instructions to be executed by the processors 910, wherein main memory may include, but is not limited to, dynamic random access memory (DRAM); a non-volatile memory; and a read only memory (ROM) 630 or other static storage device for storing static information and instructions for the processors 910.

In some embodiments, the system-in-package 905 includes one or more transmitters or receivers 940 coupled to the bus 965 to provide wired or wireless communications. In some embodiments, the system-in-package 905 includes additional logic 950, wherein the logic may be special purpose logic for more one or more purposes.

In some embodiments, the mobile device 900 may include one or more antennae 944, such as dipole or monopole antennae, for the transmission and reception of data via wireless communication using a wireless transmitter, receiver, or both, and one or more ports 942 for the transmission and reception of data via wired communications. Wireless communication includes, but is not limited to, Wi-Fi, Bluetooth™, near field communication, and other wireless communication standards. In some embodiments, the mobile device 900 includes a display 950, which may include a liquid crystal display (LCD), and may include touch sensitivity.

The mobile device 900 may also comprise a battery or other power source 960, which may include a solar cell, a fuel cell, a charged capacitor, near field inductive coupling, or other system or device for providing or generating power in the mobile device 900. The power provided by the power source 960 may be distributed as required to elements of the mobile device 900, including the system-in-package 905.

Figure 10:
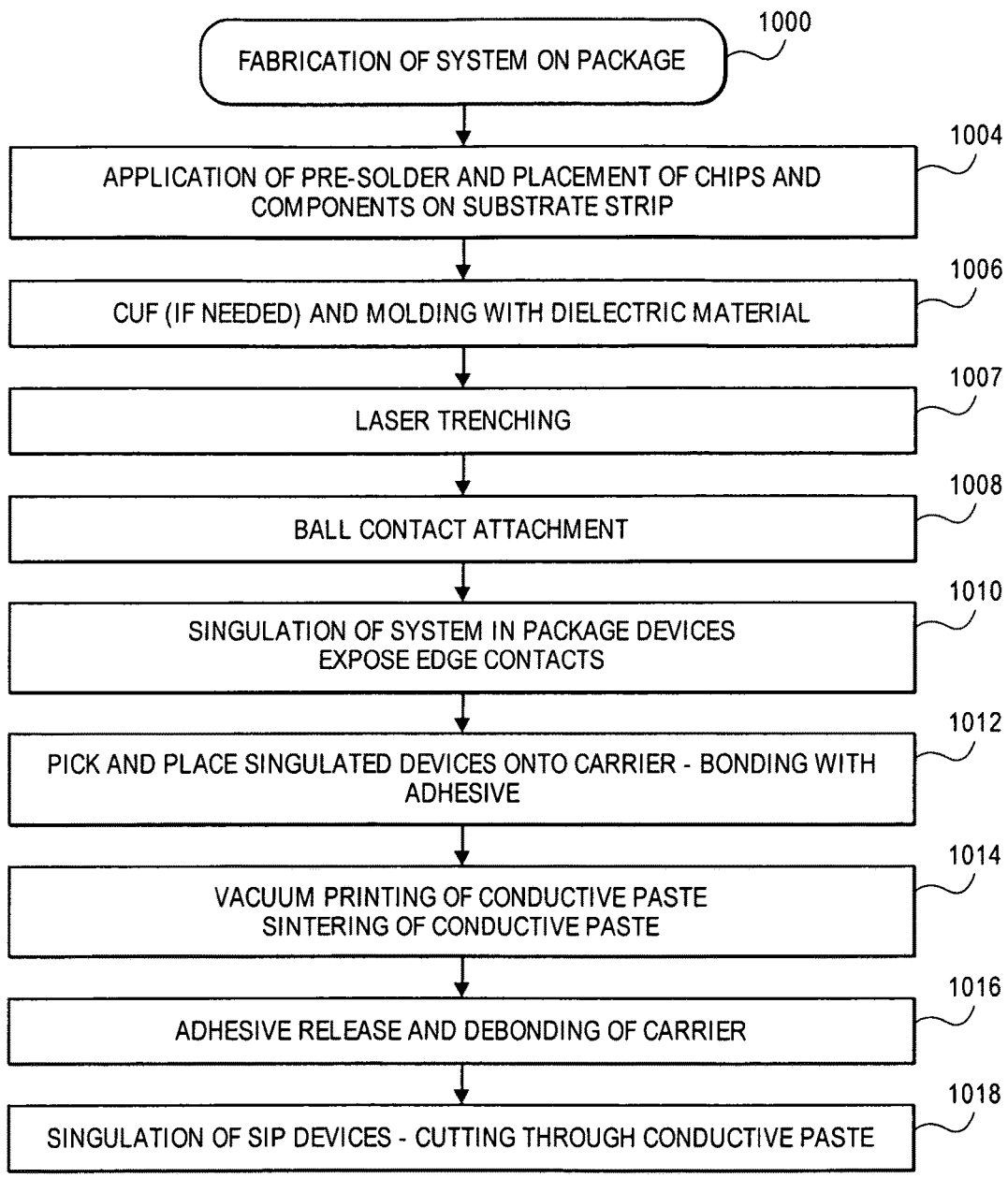
FIG. 10 is an illustration of a process for fabrication of a system-in-package with a combined internal and external EMI shielding according to an embodiment.

FIG. 10 is an illustration of a process for fabrication of a system-in-package with a combined internal and external EMI shielding according to an embodiment. In some embodiments, a process 1000 includes:

1004: Application of pre-solder on substrate strip and attachment of multiple chips and components on substrate strip.

1006: Capillary underfill (CUF) (if needed) and molding with dielectric material to form the initial elements.

1007: Perform laser trenching.

1008: Ball contact attachment.

1010: Singulation of the system-in-package devices, the singulation exposing edge contacts for each device in the substrate to provide connection to a ground plane. In some embodiments, no conductive paste is applied at this point in a fabrication process.

1012: Pick and place the singulated devices onto a carrier to be bonded with an adhesive, including placement of devices with sufficient spacing to enable a sawing process through the conductive paste at a completion of the fabrication process.

1014: Printing of conductive paste and sintering of the conductive paste. In some embodiments, the printing of the conductive paste includes vacuum printing of the paste.

1016: Adhesive release and debonding of the carrier.

1018: Singulation of the SiP devices including cutting through the conductive paste. The resulting system-in-package devices each include a combined internal and external EMI shield.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a system-in-package includes a substrate; a plurality of chips and components attached to the substrate; dielectric molding over the chips and components; and an electromagnetic interference (EMI) shield. In some embodiments, the EMI shield is formed from a conductive paste, and the EMI shield provides a combined internal EMI shield between chips and components of the system-in-package and external EMI shield for the system-in-package.

In some embodiments, wherein the conductive paste is a vacuum printed conductive paste.

In some embodiments, the system-in-package includes capillary underfill (CUF) of the chips and components.

In some embodiments, further including least one laser drilled trench. In some embodiments, the EMI shield includes shielding in the at least one laser drilled trench.

In some embodiments, the substrate includes one or more edge contacts, and wherein the conductive paste provides an electrical connection to the one or more edge contacts.

In some embodiments, the EMI shield is formed without material sputtering.

In some embodiments, a method includes attachment of multiple chips and components on a substrate strip; overmolding of chips and components; singulating a plurality of system-in-package devices including cutting through the substrate strip; placing the singulated devices onto a carrier and bonding with an adhesive, printing and sintering of a conductive paste over each of the singulated devices; adhesive release and debonding of the carrier; and singulation of a plurality of shielded system-in-package devices.

In some embodiments, the conductive paste forms a combined internal electromagnetic interference (EMI) shield and external EMI shield.

In some embodiments, the method further includes application of pre-solder on the substrate.

In some embodiments, the method further includes laser drilling at least one trench in the dielectric molding, wherein the combined EMI shield includes internal shielding in the at least one trench.

In some embodiments, printing of the conductive paste includes a vacuum printing process for the conductive paste.

In some embodiments, the method further includes performing capillary underfill (CUF) of the chips and components on the substrate strip.

In some embodiments, the singulating of a plurality of system-in-package devices including cutting of the substrate is to expose one or more edge contacts.

In some embodiments, the singulating of the plurality of shielded system-in-package devices includes cutting through the conductive paste.

In some embodiments, placing the singulated devices onto a carrier includes placement of singulated devices with sufficient spacing to enable a sawing process through the conductive paste.

In some embodiments, a mobile device includes a processor to transmit data; a transmitter to transmit data and a receiver to receive data; and an antenna for data transmission. In some embodiments, at least the processor is included in a system-in-package, and the system-in-package including a substrate; a plurality of chips and components attached to the substrate; dielectric molding over the chips and components; and an electromagnetic interference (EMI) shield, wherein the EMI shield formed from a conductive paste, and the EMI shield providing a combined internal EMI shield between chips and components of the system-in-package and external EMI shield for the system-in-package.

In some embodiments, the system-in-package includes at least one laser drilled trench. In some embodiments, the EMI shield includes shielding in the at least one laser drilled trench.

In some embodiments, the substrate includes one or more edge contacts, and wherein the conductive paste provides an electrical connection to the one or more edge contacts.

What is claimed is:

1. A system-in-package comprising:
    a substrate;
    a plurality of chips and components attached to the substrate, wherein a first of the plurality of chips and a second of the plurality of chips are attached to the substrate and are laterally adjacent to one another;
    dielectric molding over the chips and components; and
    an electromagnetic interference (EMI) shield over the system-in package, wherein:
        the EMI shield being formed from a conductive paste, and
        the EMI shield to provide a combined internal EMI shield between the chips and components of the system-in-package and external EMI shield for the system-in-package, wherein the EMI shield is continuous over the chips, laterally between the laterally adjacent first and second of the plurality of chips, and along sidewalls of the substrate.

2. The system-in-package of claim 1, further comprising capillary underfill (CUF) of the chips and components.

3. The system-in-package of claim 1, further comprising least one laser drilled trench.

4. The system-in-package of claim 3, wherein the EMI shield includes shielding with the conductive paste in the at least one laser drilled trench.

5. The system-in-package of claim 1, wherein the substrate includes one or more edge contacts, and wherein the conductive paste provides an electrical connection to the one or more edge contacts.

6. The system-in-package of claim 1, wherein EMI shield is formed without material sputtering.

7. The system-in-package of claim 1, wherein the adhesive of the conductive paste is an epoxy.

8. A method comprising:
    attachment of multiple chips and components on a substrate strip, wherein a first of the multiple chips and a second of the multiple chips are attached to the substrate strip and are laterally adjacent to one another;
    overmolding of chips and components;

singulating a plurality of system-in-package devices including
cutting through the substrate strip to form a cut substrate strip;
placing the singulated devices onto a carrier and bonding with an adhesive;
printing and sintering of a conductive paste over each of the singulated devices, and wherein printing of the conductive paste includes a vacuum printing process for the conductive paste, wherein the conductive paste is continuous over the chips, laterally between the laterally adjacent first and second of the multiple of chips, and along sidewalls of the cut substrate strip;
adhesive release and debonding of the carrier; and
singulating a plurality of shielded system-in-package devices.

9. The method of claim 8, wherein the conductive paste forms a combined internal electromagnetic interference (EMI) shield and external EMI shield.

10. The method of claim 8, further comprising:
application of pre-solder on the substrate.

11. The method of claim 10, further comprising:
laser drilling at least one trench in the dielectric molding, wherein the combined EMI shield includes internal shielding with the vacuum printed conductive paste in the at least one trench.

12. The method of claim 8, further comprising performing capillary underfill (CUF) of the chips and components on the substrate strip.

13. The method of claim 8, wherein the singulating of a plurality of system-in-package devices including cutting of the substrate to expose one or more edge contacts.

14. The method of claim 8, wherein the singulating of the plurality of shielded system-in-package devices includes cutting through the conductive paste.

15. The method of claim 14, further wherein placing the singulated devices onto a carrier includes placement of singulated devices with sufficient spacing to enable a sawing process through the conductive paste.

16. A mobile device comprising:
a processor to transmit data;
a transmitter to transmit data and a receiver to receive data; and an antenna for data transmission;
wherein at least the processor is included in a system-in-package, and wherein the system-in-package includes:
a substrate;
a plurality of chips and components attached to the substrate, wherein a first of the plurality of chips and a second of the plurality of chips are attached to the substrate and are laterally adjacent to one another;
dielectric molding over the chips and components; and
an electromagnetic interference (EMI) shield over the system-in-package, wherein: the EMI shield being formed from a conductive paste, and
the EMI shield providing a combined internal EMI shield between chips and components of the system-in-package and external EMI shield for the system-in-package, wherein the EMI shield is continuous over the chips, laterally between the laterally adjacent first and second of the plurality of chips, and along sidewalls of the substrate.

17. The mobile device of claim 16, wherein the system-in-package includes at least one laser drilled trench.

18. The mobile device of claim 17, wherein the EMI shield includes shielding with the vacuum printed conductive paste in the at least one laser drilled trench.

19. The mobile device of claim 16, wherein the substrate includes one or more edge contacts, and wherein the conductive paste provides an electrical connection to the one or more edge contacts.

* * * * *